United States Patent [19]

Anthony et al.

[11] Patent Number: 5,175,929
[45] Date of Patent: Jan. 5, 1993

[54] METHOD FOR PRODUCING ARTICLES BY CHEMICAL VAPOR DEPOSITION

[75] Inventors: Thomas R. Anthony, Schenectady; James F. Fleischer, Scotia, both of N.Y.

[73] Assignee: General Electric Company, Schenectady, N.Y.

[21] Appl. No.: 845,992

[22] Filed: Mar. 4, 1992

[51] Int. Cl.$^5$ .............................................. B23P 17/00
[52] U.S. Cl. ............................... 29/890.142; 29/423; 29/527.3; 264/219; 427/135; 428/577
[58] Field of Search ............... 29/890.142, 890.14, 29/423, 527.1, 527.3, 527.4; 427/133, 135, 237, 239, 249, 38, 39, 45.1; 264/81, 219; 156/637, 657, 664; 428/34.1, 687, 576, 577, 408; 423/446

[56] References Cited

U.S. PATENT DOCUMENTS

| | | | |
|---|---|---|---|
| 3,138,434 | 6/1964 | Diefendorf | 264/81 |
| 3,399,969 | 9/1968 | Bokros et al. | 264/81 |
| 4,160,797 | 7/1979 | Göppinger et al. | 264/219 X |
| 4,220,618 | 9/1980 | Pierson et al. | 264/219 |
| 4,292,342 | 9/1981 | Sarma et al. | 264/81 |
| 4,707,384 | 11/1987 | Schachner et al. | |
| 4,749,587 | 6/1988 | Bergmann et al. | |
| 4,830,702 | 5/1989 | Singh et al. | |
| 4,987,002 | 1/1991 | Sakamoto et al. | 264/81 X |

OTHER PUBLICATIONS

Article-Ceramic Bulletin, vol. 69, No. 6, (1990)—High Pressure Waterjet Cutting: An Introduction, Jayanta K. Guha—pp. 1027-1029.
Reprint from American Machinist, Oct. 1989, A Penton Publication, Cleveland, Ohio—Wet Grit Abrasive Waterjets A Special Report—Water & Sand Cut It—p. 84.
Article-Chemical Vapor Deposition, Deepak G. Bhat, Surface Modification Technologies, An Engineering Guide edited by T. S. Sudarshan 1989 Edition, Marcel Dekkers, Inc. 270 Madison Ave., NY, NY 10016, pp. 141-219.
Article-Chemical Vapour Deposition (CVD)-Metallic & Ceramic Coatings: Production, High Temperature Properties & Applications, MG Hocking, V. Vasantasree & P. S. Sidky, 1989 Edition, Longman Scientific & Technical Group, Essex, England (U.K.) copublished w/John Wiley & Sons Inc., New York, NY 10158, pp. 103-172.
Article—Special Report—Emerging Technology of Diamond Thin Films, PK Bachmann and R Messler—C&EN, May 15, 1989 pp. 24-39.

*Primary Examiner*—Timothy V. Eley
*Attorney, Agent, or Firm*—William H. Pittman

[57] ABSTRACT

An improved method of producing articles by chemical vapor deposition and articles made therefrom. The method comprises machining an appropriate shape on a suitable substrate, positioning an insert within the shape, depositing a support member material on the shape and the insert to produce a support member, separating the support member from the substrate, chemically vapor depositing an article material on the support member and etching away the support member to produce a free standing article, such as a funnel shaped diamond waterjet mixing tube.

17 Claims, 5 Drawing Sheets

METHOD FOR PRODUCING ARTICLES BY CHEMICAL VAPOR DEPOSITION

CROSS REFERENCE TO RELATED APPLICATIONS

Reference is made to a commonly assigned, copending application, Ser. No. 07/713,499, filed on Jun. 12, 1991, for An Improved Method for Producing Articles by Chemical Vapor Deposition and The Articles Produced Therefrom.

FIELD OF THE INVENTION

The present invention generally relates to an improved method used for producing articles by chemical vapor deposition and more particularly concerns a method of producing improved support mandrel, having a high length to diameter (L/D) ratio, used in producing funnel shaped water-jet mixing tubes made from diamond.

BACKGROUND OF THE INVENTION

Diamond is an allotrope of carbon exhibiting a crystallographic network comprising exclusively of covalently bonded, aliphatic $sp^3$ hybridized carbon atoms arranged tetrahedrally with a uniform distance of 1.545 Å between atoms. Diamond is extremely hard having a Mohs hardness of 10. It exhibits four times the thermal conductivity of copper and it is electrically insulating. Its hardness and thermal properties are but two of the characteristics that make diamond useful in a variety of industrial components. Initially non-gem quality natural diamonds were used in a variety of abrasive applications but with the invention of synthetic diamonds by high pressure/high temperature techniques, a spectrum of additional products have found favor in the marketplace. However, the requirement of high pressure and high temperature has been a limitation in preventing extensive usage of synthetic diamonds.

Recent industrial efforts directed toward the growth of diamonds at low pressures has dramatically increased the feasibility of using diamonds in various industrial applications. Low pressure growth of diamond has been dubbed "chemical vapor deposition" or "CVD" in the field. In the CVD process diamonds are grown at low pressures from hydrocarbon gases in the presence of atomic hydrogen. Many methods have been disclosed for growing diamonds metastably and generally these methods differ from each other by the way in which atomic hydrogen, a key reactant, is generated and transported within the system. For a general summary of various diamond deposition methods including CVD methods, reference is made to Bachmann, et al., *Diamond Thin Films*, Chemical & Engineering News, 67(20), 24–39 (May 15, 1989), to Bhat, D., *Chemical Vapor Deposition, Surface Modification Technologies, An Engineer's Guide*, edited by Sudarshan, T., 1989 Edition, Marcel Dekker, Inc., New York, N.Y., pages 141–218, and to Hocking, M., Vasantasree, V., and Sidky, P., *Chemical Vapour Deposition, Metallic & Ceramic Coatings: Production, High Temperature Properties & Application*, Longman Scientific & Technical Group, England (U.K.) copublished with John Wiley & Sons, New York, N.Y., pages 103–172, all incorporated herein by reference.

When a free standing diamond film for example having a funnel shape is desired, it is very cumbersome and invariably impractical to prepare a substrate on which such a film could be deposited. In one of the prior art methods a funnel shape is machined from a tubular shape. However it is very difficult and expensive to machine material such as diamond to the degree of precision required in high pressure water jet cutting systems. For a general summary of various hydromachining methods including water jet cutting methods, reference is made to a special report on *Wet Grit, Abrasive Waterjets*, American Machinist, October 1989, Penton Publishing, Inc., Cleveland, Ohio, pages 84–97 and to Guha, J., *High-Pressure waterjet Cutting: An Introduction*, Ceramic Bulletin, Vol. 69, No. 6, 1990, pages 1027–1029, both incorporated herein by reference.

A method directed to machining a funnel shape on a substrate, depositing a funnel material on the funnel shape, separating the funnel from the substrate, depositing diamond on the funnel and then separating the funnel shaped diamond article from the funnel has been disclosed. However, by way of example, it is difficult to deposit the funnel material on a funnel shape having a small diameter stem of about 0.500 millimeter outer diameter and having a long funnel length of about 75 millimeters. The present invention is directed to addressing the problem of making such funnel shaped articles.

STATEMENT OF THE INVENTION

The present invention is directed to an improved method of producing an article comprising workforming a substrate to form a surface having a desired shape thereon, positioning an insert on the surface of the substrate, depositing a support member material on the surface and a portion of the insert to form a support member thereon, separating the support member from the substrate, chemical vapor depositing an article material on the support member to form the article thereon, and separating the article from the support member.

DETAILED DESCRIPTION OF THE PREFERRED EMBODIMENT

In recent years, the synthesis of free standing articles made from diamond films has been extensively researched. One of the major problems associated with producing such free standing articles is the method by which the underlying substrate is produced.

Turning now to FIGS. 1A through 1G, there is shown a method by which the free standing article made from an article material such as diamond, is produced through the steps of the preferred embodiment.

Figure 1A:
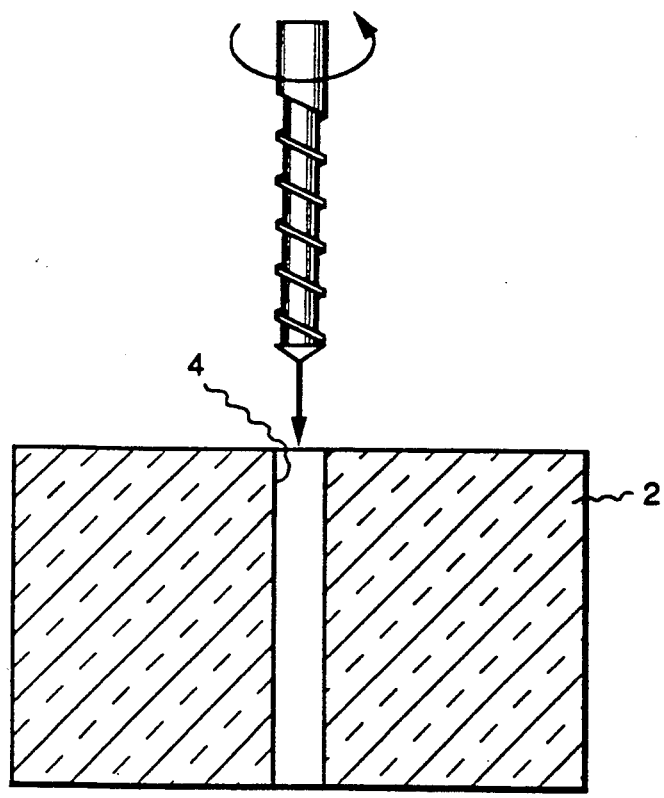
FIG. 1A and FIG. 1B illustrate a cross sectional view of a substrate during the workforming steps of the preferred embodiment.
Figure 1B:
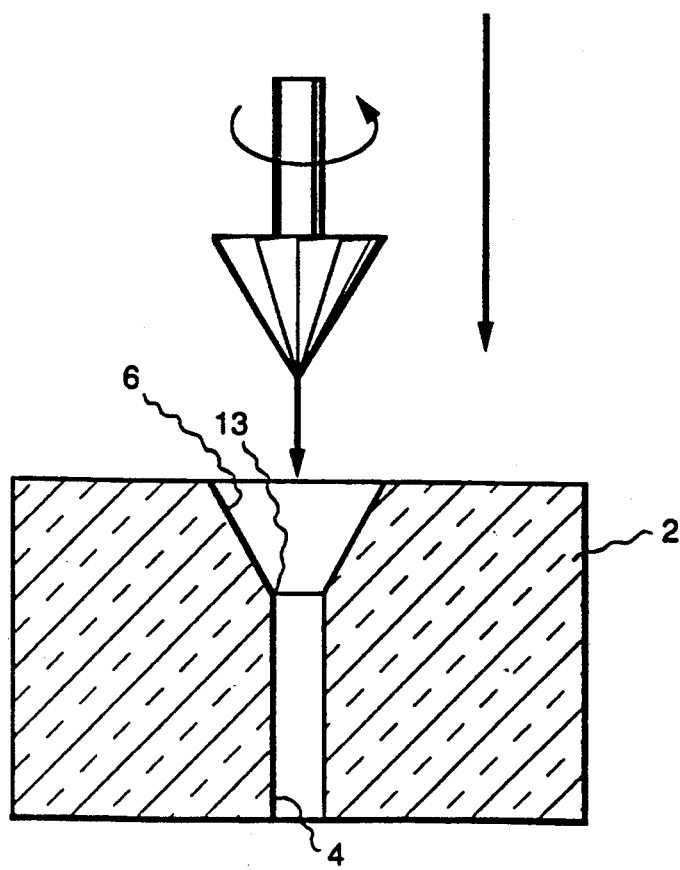

In FIG. 1A there is shown the workforming step such as drilling performed by a drill on a substrate 2 for producing a substantially straight bore 4, shown in the cross section. The term "workforming" is defined as a method by which substrate 2 may be shaped, machined, or modified in a predetermined manner. In FIG. 1B bore 4 is modified by means, such as a spade drill, to form a surface 6 having a desired shape, such as a funnel shape, on substrate 2. Alternatively, bore 4 and surface 6 may be workformed simultaneously on substrate 2 by a combination drill (not shown), thereby reducing the number of steps required to form the desired shape on substrate 2. However, it should be apparent to those skilled in the art to use some other workforming steps, such as milling, grinding, electrical discharge machining, boring, shaping, honing, molding or diecasting, to form the desired surface 6 on substrate 2. Substrate 2 may be made of a workformable and thermally stable material, such as an allotrope of carbon in graphitic form or stainless steel comprising at least 12% chromium. However, some other thermally stable material may be also used. Once the workforming step is completed, bore 4 and surface 6 may be cleaned with cleaning means, such as a high pressure air jet, to remove debris formed during the workforming step.

Figure 1C:
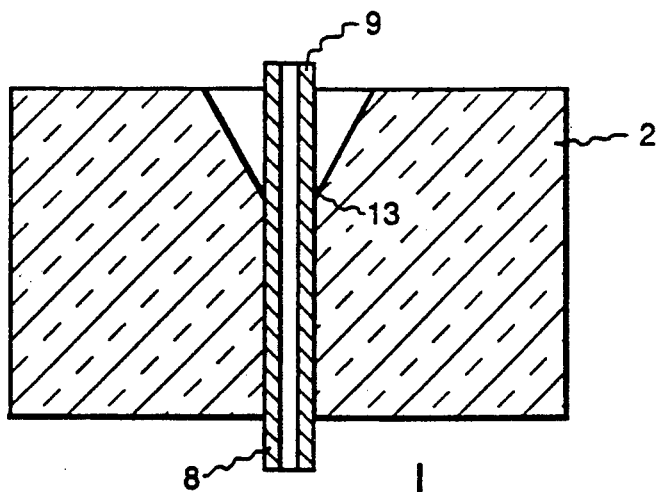
FIG. 1C illustrates the cross sectional view of the substrate during the positioning of an insert along workformed surfaces of the substrate.

Upon completion of the workforming step, an insert 8, typically a hollow elongated member, such as a tube, is positioned, as shown in FIG. 1C, along bore 4 in substrate 2. If so desired, insert 8 may be solid. Preferably, insert 8 is press fitted into bore 4 in such a way that there is substantially no gap between the outer diameter of insert 8 and a transition point 13 between bore 4 and surface 6. The insert 8 may be made from a thermally stable metal, such as tungsten, molybdenum, rhenium, niobium, tantalum, zirconium, hafnium, nickel, vanadium, chromium or titanium. Tungsten is preferred.

Figure 1D:
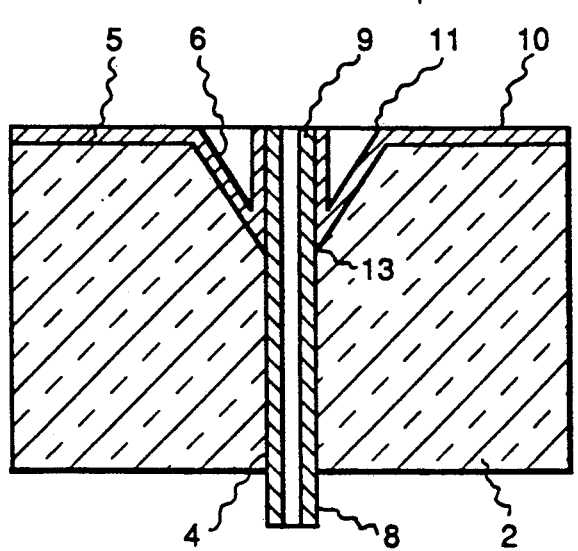
FIG. 1D illustrates the cross sectional view of the substrate after a chemical vapor deposition step of a support member on the workformed surfaces of the substrate and the insert.

As shown in FIG. 1D, a film 10 of support member material is then conventionally deposited on surfaces 5 and 6 of substrate 2 as well as on a portion 9 of insert 8. The deposition of the support member material can be achieved by well known methods of the art, for example by a CVD process. The process of the preferred embodiment is the CVD process for chemical vapor deposition of film 10. The support member material suitable for the CVD process may be same as the abovedescribed material for insert 8. Tungsten is preferred and preferably film 10 is made of same material as that used for insert 8.

During the CVD process of the preferred embodiment, not shown, a vapor of a compound of the support member material, preferably tungsten hexafluoride, is preferably entrapped in hydrogen gas to form a first gaseous mixture which may be then conveyed into a CVD reaction chamber. The volumetric ratio of hydrogen to the metal compound vapor may be maintained at about 3:1 to about 30:1, preferably at about 7.5:1. The metal compound vapor is preferably formed by surrounding a container of the metal compound with a heat jacket maintained at a temperature sufficient to vaporize the metal compound. The first gaseous mixture may be diluted with an inert gas, such as argon.

The first mixture is preferably energized by heating means, such as radio frequency (RF) heating means exemplified by a RF coil proximately positioned near substrate 2. The RF field generates heat in substrate 2 and by regulating the intensity of the radio frequency and the distance between the RF coil and substrate 2, the temperature of substrate 2 may be adjusted to a desired level. The temperature of substrate 2 may be maintained at about 250° C. to about 800° C., preferably at about 600° C. The support member material derived from the first gaseous mixture is chemically vapor deposited on surface 6 and surface 5 of substrate 2 and portion 9 of insert 8 to form film 10, which substantially conforms to surfaces 5 and 6 of substrate 2 and portion 9 of insert 8.

A portion of film 10 forming the cone shape on surface 6 is detached from film 10 along an intersection 11 of surfaces 5 and 6 by cutting means, such as a Nd-YAG, Q-switched laser.

Figure 1E:
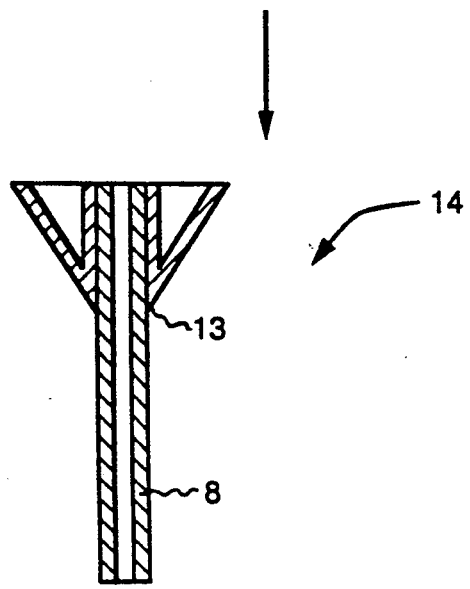
FIG. 1E illustrates the cross sectional view of the support member after separation of the substrate from the support member.

The cone shaped portion of film 10 attached to portion 9 of insert 8 along with insert 8 is then separated from substrate 2 and the remaining portion of film 10. One of the methods of separation is by using a compatible release agent, such as boron nitride or silica, applied on surface 6 of substrate 2 prior to the chemical vapor deposition of the support member material. Another method of separation is by selecting the insert and support member materials having higher coefficients of thermal expansion than substrate 2, such that when the cone shaped portion of film 10 and insert 8 cool, they contract and detach away from substrate 2. Yet another method of separation is by physically forcing the cone shaped portion of film 10 and insert 8 away from substrate 2. A method of separation through thermal contraction is preferred. FIG. 1E shows a support member 14 after it is separated from the remaining portion of film 10 and substrate 2. Preferably support member 14 is a hollow mandrel having a thickness of about 80 to about 110 micrometers. However, to one skilled in the art it will be apparent to adjust the thickness of support member 14, shown in FIG. 1E, to a thickness sufficient to withstand the requirements of the CVD process. Additionally, deposition of the support member material along portion 9 of insert 8 increases the structural strength of support member 14, especially for the support members that have high L/D ratios, such as the support members comprising insert tubes of about 100 millimeters length and about 0.4–0.50 millimeters outside diameters with a wall thickness of about 0.08 millimeters.

Figure 1F:
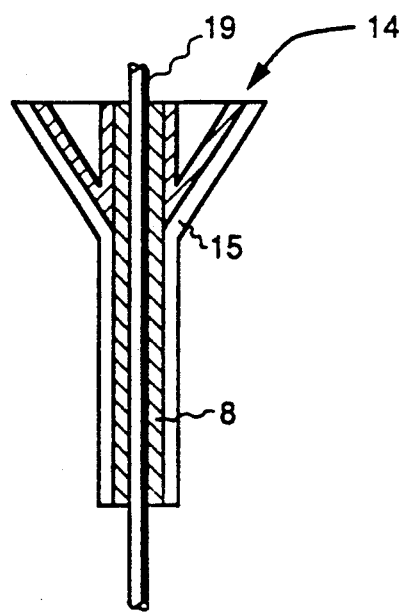
FIG. 1F illustrates the cross sectional view of the support member during a chemical vapor deposition step of an article material on the support member.
Figure 1G:
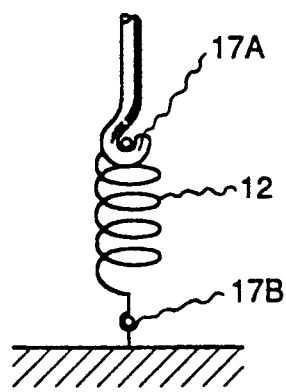
FIG. 1G illustrates the cross sectional view of the article after the separation of the support member from the article.
Figure 1G:
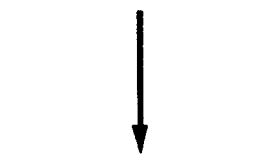
Figure 1G:
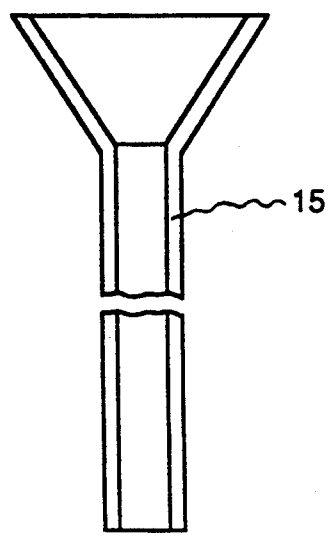

Support member 14 is then exposed to a conventional CVD process, not shown, for chemical vapor deposition of the article material on support member 14 to form a free standing article 15, shown in FIG. 1G. The article material may be carbon, silicon, germanium, boron, aluminum, zirconium, tungsten, titanium or molybdenum. The preferred article material is an allotrope of carbon in the form of diamond. As shown in FIG. 1F, support member 14 may be supported during the CVD process on mounting means, such as a taut rod 19, under a tensile load provided by biased means, such as a tension spring 12, fastened by hook means 17A and 17B to the walls of a CVD chamber, not shown. Rod 19, preferably having an outer diameter substantially close to that of the inner diameter of insert 8, is passed through insert 8 to prevent buckling or warpage of support member 14 during chemical vapor deposition of the article material. Tension spring 12 compensates for any changes in length of rod 19 due to thermal expansion during the CVD process. During the CVD process a compound of the article material, preferably methane, may be entrapped in hydrogen gas to form a second gaseous mixture which may be then conveyed into a CVD reaction chamber. It will be obvious to those skilled in the art to either use the same CVD reaction chamber for depositing the support member and the article materials or to use different CVD reaction chambers for depositing the support member and the article materials. The second gaseous mixture may comprise about 1% to about 2%, preferably about 1.5% by volume of the compound of the article material, the rest being hydrogen. The second gaseous mixture may be diluted with an inert gas, such as argon.

The rate of diamond deposition may be enhanced by improving the nucleation of diamond on support member 14 during the CVD process. The preferred method of improving the diamond nucleation comprises rubbing a surface of support member 14 on which diamond is deposited with a hydrocarbon oil based paste of diamond dust before the surface is exposed to the deposition of diamond by the CVD process. The particle size of diamond dust in the paste may be about 0.5 to about 1 microns and the surface of support member 14 may be rubbed for about 2 to about 5 minutes. Another method of improving the diamond nucleation, for example, comprises contacting for about 5 minutes, the surface of support member 14 with an agitated suspension in alkanol of diamond particles having a size of about one micron. An ultrasonically agitated suspension of diamond particles in ethyl alcohol is preferred.

The second gaseous mixture may be energized by heating means, such as passing the second mixture over a non-reactive filament, such as tungsten, sufficiently heated to thermally decompose the second mixture. The filament may be resistively heated to generate heat. If desired, a plurality of filaments may be employed. The rate of chemical vapor deposition of the article material on support member 14 may be controlled by regulating the electrical power applied to the filament and by adjusting the distance between the filament and support member 14. The temperature of filament may be maintained at about 1900° C. to about 2400° C., preferably at about 2150° C. The article material, such as diamond is then chemically vapor deposited on the surface of support member 14 to form a film comprising article 15.

A desired portion of the film that contains article 15 is separated by cutting means such as a Nd-YAG, Q-switched laser, not shown, from the remaining film. FIG. 1F shows support member 14 having article 15 deposited thereon. Article 15 formed on the surface of support member 14 is then separated from support member 14. One of the methods of separation comprises etching away support member 14 by an etching bath and thereby leaving a free standing article 15 shown in FIG. 1G. Support member 14 having article 15 formed thereon may be placed in the etching bath which may be then agitated to etch away support member 14. One of the etching baths suitable for use in the present invention comprises an aqueous solution containing equal parts of hydrochloric acid at a concentration of about 36% to about 38% by weight, nitric acid at a concentration of about 69% to about 71% by weight and hydrofluoric acid having a concentration of about 49% to about 51% by weight. The etching bath may be agitated by ultrasonic means for dislodging the bubbles formed on support member 14 during the etching action. Another method of separating support member 14 from article 15 made of diamond comprises using niobium as a support member material. Niobium is substantially less adherent to diamond than to the support member material such as tungsten. Support member 14 made of niobium can be easily separated form article 15 and then used repeatedly to form article 15 on it.

In another embodiment of the present invention film 10, shown in FIG. 1D, is deposited on substrate 2 by an electroforming process. The electroforming process is defined as a conventional plating process by which the support member material is plated or deposited on substrate 2 to form support member 14. Typical plating processes suitable for use in the present invention are an electroless, electrolytic or a combination of an electroless and electrolytic plating process. Preferably, support member 14 is prepared by the electroforming process comprising an electrolessly deposited first metal layer followed by an electrolytically deposited second metal layer.

Substrates suitable for the electroless plating process may be electrically conductive substrates made from metals and their alloys, such as aluminum or electrically insulating substrates made from polymers, such as polystyrene or polycarbonate. In the case of a polymer substrate, such as polycarbonate substrate, it is often necessary to activate the substrate surface before it can be electrolessly plated. Activation of the polymer substrate for plating purposes can be achieved by well known methods of the art. For example, the substrate may be contacted with an acid solution of a precious metal, such as palladium chloride in hydrochloric acid, for a period of time sufficient to cause catalytic activation of the polymer substrate surface.

After surface activation and rinsing, electroless plating can be undertaken to form the first metal layer. Illustrative metals used to form the first metal layer include zinc, silver, palladium, copper, nickel, cobalt, chromium, molybdenum and various possible combinations thereof. The term "combinations" is defined to mean multiple layers of various metals deposited on the polymer surface in any desired order. Electroless baths are well-known in the art and are generally described in the *Kirk-Othmer Encyclopedia of Chemical Technology*, 3rd Edition, Volume 8.

Although the aforementioned electroless plating is the preferred application method for the first metal layer, electrolytic plating may be also used. However electrolytic plating also called electroplating is the preferred application method for the second metal layer.

Electroplating baths are well-known in the art and are described, for example, in U.S. Pat. No. 4,555,315, incorporated herein by reference, although the particular electroplating bath used is not critical to the present invention. The choice of course depends in part on the particular metal being deposited. However the metal forming the second metal layer should have a melting point of at least 1000° C. to withstand the typical CVD diamond deposition temperatures. Illustrative metals used to form the second metal layer include copper, palladium, nickel, cobalt, chromium, niobium, titanium, tantalum, molybdenum and various possible combinations thereof. Furthermore, those skilled in the art appreciate that the particular bath contents will depend upon some of the factors considered for the electroless deposition of metal described above. A description of baths for plating copper or various other metals is given in the *Kirk-Othmer* reference described above, in Vol. 8, beginning on page 826. A polycarbonate substrate having a first layer of zinc followed by a second layer of chromium is most preferred.

Figure 2:
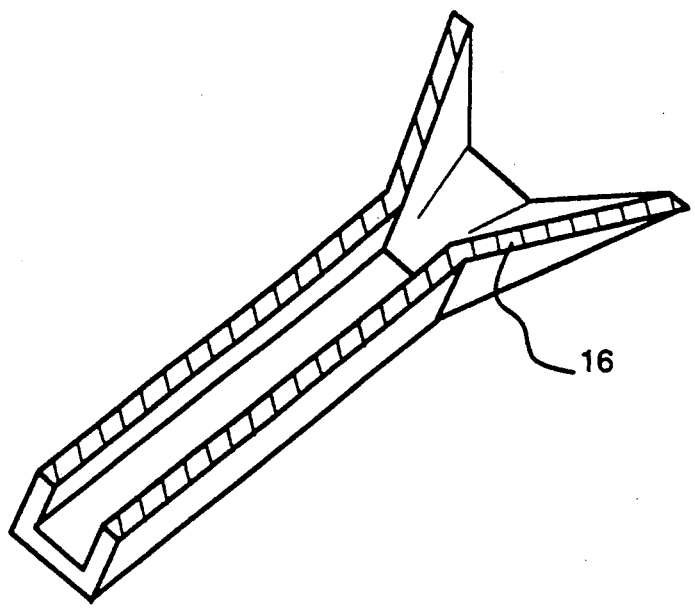
FIGS. 2 illustrates the isometric cross sectional view of another embodiment of the article.

Another embodiment of the present invention is illustrated in FIG. 2. A hexagonal shaped funnel 16 having a retangular spout is disclosed.

Figure 3:
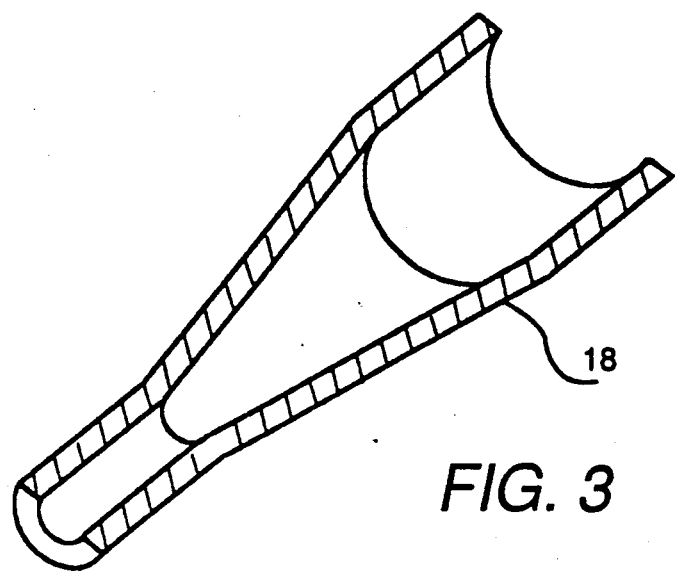
FIG. 3 illustrates the isometric cross sectional view of yet another embodiment of the article.

Yet another embodiment of the present invention is illustrated in FIG. 3. A cone shaped funnel 18 having a cylindrical extension and a cylindrical spout is disclosed.

Figure 4:
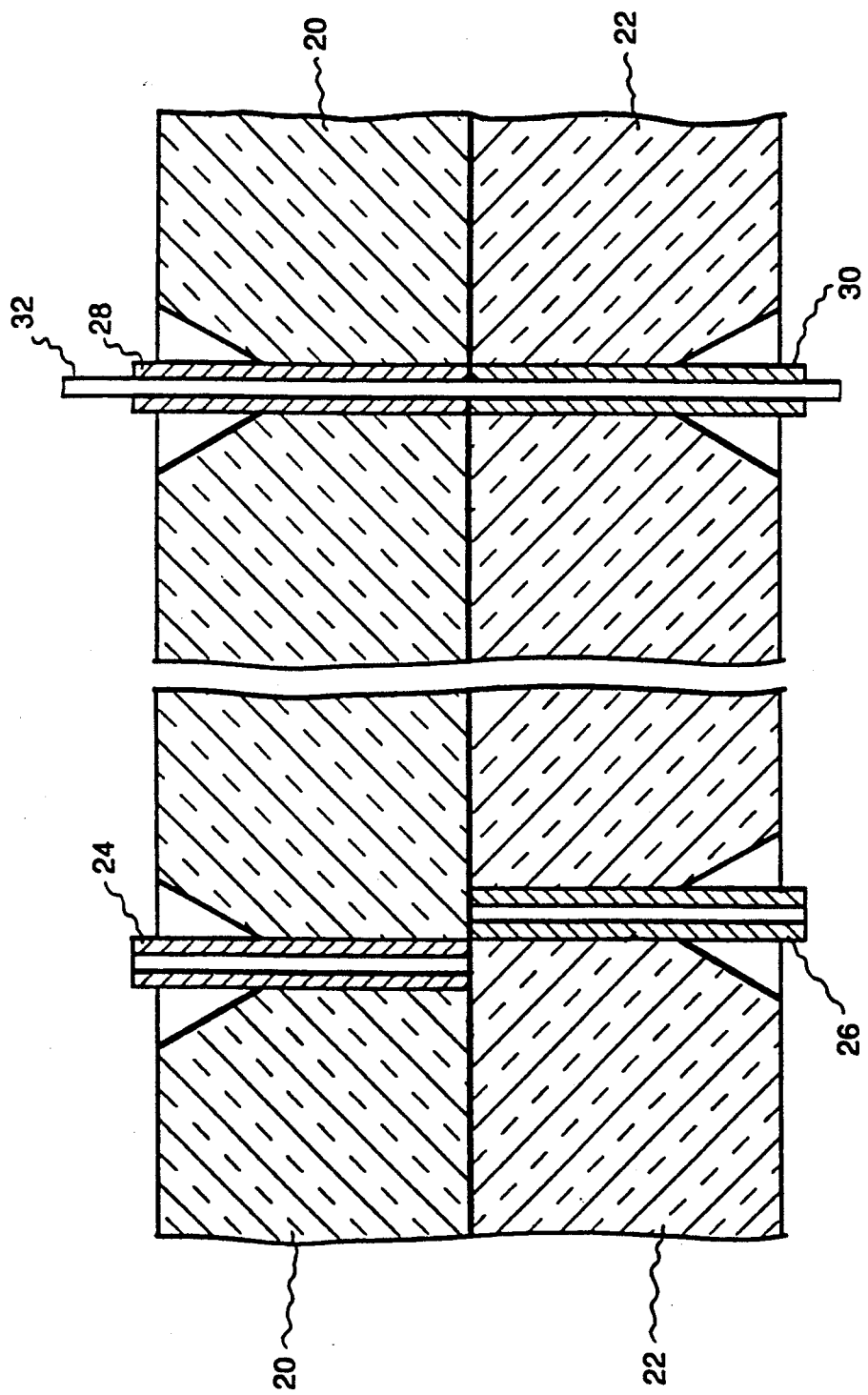
FIG. 4 illustrates a method of simultaneously producing multiple support members according to the steps of the present invention.

FIG. 4 shows a method of simultaneously making several of the support members by the method of the present invention. Substrates 20 and 22 having workformed surfaces thereon are pressed against each other before the deposition of the support member material. By way of example, Inserts 24, 26, 28 and 30 are pressed into position along the work formed surfaces. The inserts, such as 28 and 30, may be aligned and supported with a rod 32. Alternatively, the inserts, such as 24 and 26, may not contact one another. The method of FIG. 4 is suitable for the aforementioned CVD process or the electroforming process.

The articles produced by the method of the present invention may be used, for example, in producing fluid nozzles, water-jet mixing tubes, heat sinks for integrated circuit chips, wire guides for electrical discharge machines, thread guides for textile machinery and test tubes.

EXAMPLE

The process in the example set forth below was carried out by the steps described above and illustrated in FIGS. 1A through 1G.

A substrate made of graphite was a 4 inch diameter by 1 inch thick disc. 48 funnel shapes drilled in the substrate had a total surface area of 191 square centimeters. The substrate, placed in the first CVD. reaction chamber, was provided with RF heat to raise its temperature to 600° C.

Tungsten hexafluoride ($WF_6$) liquid was vaporized at 35° C. to provide a steady flow regulated at a flow rate of 350 standard cubic centimeters per hour, hereinafter SCCM. Tungsten hexafluoride was mixed with hydrogen at a flow rate of 6000 SCCM to form the first mixture, then conveyed into the CVD reaction chamber maintained at 10 Torr pressure. The first mixture was energized by the heat from the substrate to chemically vapor deposit tungsten on the surface of the substrate containing the funnel shape. Tungsten was deposited at a deposition rate of 1.7 micrometers per minute for 60 minutes to produce a tungsten film of 102 micrometers on the surface of the substrate.

The funnel shaped hollow tungsten mandrels formed on the surface of the substrate were separated from the rest of the tungsten film by means of a Nd-YAG, Q-switched laser, Model No. 4024 made by U.S. Laser Corporation, Waldwick, N.J. and then forced out of the funnel shapes in the substrate.

The mandrels were vertically strung on tungsten wires tautly held under tension and placed in the CVD reaction chamber. Eleven vertical rows of tungsten filaments having a height of 11 inches were interspaced with ten rows of mandrels having a height of 10 inches, each row spaced from the other at about 1 centimeter.

The tungsten filaments were heated to 2150° C. and the second mixture comprising 1.5% by volume of methane and 98.5% by volume of hydrogen was passed over the heated filaments at a rate of 2 standard liters per minute for 3 weeks. The second reaction chamber was maintained at 10 Torr and diamond was chemically vapor deposited to a thickness of 1 millimeter. The mandrels containing the funnel shaped diamond water-jet mixing tubes were separated from the rest of the diamond film by a Nd-YAG, Q-switched laser, Model No. 4024 made by U.S. Laser Corporation, Waldwick, N.J. and then the mandrels were etched away by exposing them to the etching bath of the preferred embodiment for 10 minutes to form the free standing funnel shaped diamond water-jet mixing tubes. The mixing tubes were 7.62 centimeters long having an inner diameter of 0.102 centimeters and a funnel diameter of 0.457 centimeters.

What is claimed is:

1. A method of producing an article comprising:
   workforming a substrate to form a surface having a desired shape thereon;
   positioning an insert on said surface of said substrate;
   depositing a support member material on said surface and at least a portion of said insert to form a support member thereon;
   separating said support member including a portion of said insert from said substrate;
   chemical vapor depositing an article material on said support member to form said article thereon; and
   separating said article from said support member.

2. The method according to claim 1 wherein said workforming step further comprises drilling said substrate with a drill having said shape.

3. The method according to claim 1 wherein said step of depositing further comprises chemically vapor depositing said support member material on said surface and said portion of said insert.

4. The method according to claim 3 wherein said support member material is selected from the group consisting of tungsten, molybdenum, rhenium, niobium, tantalum, zirconium, hafnium, nickel, vanadium, chromium and titanium.

5. The method according to claim 1 wherein said insert is made from material selected from the group consisting of tungsten, molybdenum, rhenium, niobium, tantalum, zirconium, hafnium, nickel, vanadium, chromium and titanium.

6. The method according to claim 1 wherein said insert is made of the same material as said support member material.

7. The method according to claim 1 wherein said step of depositing further comprises electroforming said support member material on said surface and said portion of said insert.

8. The method according to claim 7 wherein said step of electroforming further comprises:
   electrolessly depositing a first metal layer on said surface of said substrate and said portion of said insert; and
   electrolytically depositing a second metal layer on said first metal layer.

9. The method according to claim 8 wherein said substrate is polycarbonate.

10. The method according to claim 8 wherein said first metal layer is zinc and said second metal layer is chromium.

11. The method according to claim 1 wherein said step of separating said support member from said substrate further comprises applying a release agent on said surface prior to said depositing of said support member material on said surface of said substrate.

12. The method according to claim 1 wherein said step of separating said article from said support member further comprises etching away said support member in an etch bath.

13. The method according to claim 12 wherein said etching bath is ultrasonically agitated to dislodge bubbles formed on said support member during said etching action.

14. The method according to claim 1 wherein said support member is a funnel shaped hollow mandrel.

15. The method according to claim 1 wherein said article is made from materials selected from the group consisting of carbon, silicon, germanium, boron, aluminum, zirconium, tungsten, titanium and molybdenum.

16. The method according to claim 15 wherein said article is made of an allotrope of carbon in the form of diamond.

17. The method according to claim 1 wherein said article is a funnel shaped diamond water-jet mixing tube.

* * * * *